United States Patent
Scardaci et al.

(10) Patent No.: US 6,549,486 B1
(45) Date of Patent: Apr. 15, 2003

(54) CIRCUIT FOR GENERATING AN ATD PULSE SIGNAL INDEPENDENT OF VOLTAGE AND TEMPERATURE VARIATIONS

(75) Inventors: Massimo Scardaci, Aci Castello (IT); Ignazio Martines, Aci Castello (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/998,903

(22) Filed: Oct. 31, 2001

(51) Int. Cl.$^7$ ................................................ G11C 8/18
(52) U.S. Cl. ..................... 365/233.5; 365/233; 365/212; 365/211; 326/95; 326/93
(58) Field of Search ............................. 365/233.5, 233, 365/212, 211, 230.08; 326/98, 95, 93

(56) References Cited

U.S. PATENT DOCUMENTS 3,902,082 A * 8/1975 Proebsting et al. ......... 327/213
4,451,906 A * 5/1984 Ikeda ......................... 365/205
4,528,465 A * 7/1985 Harvey ....................... 326/127

* cited by examiner

Primary Examiner—Andrew Q. Tran
(74) Attorney, Agent, or Firm—Allen, Dyer, Doppelt, Milbrath & Gilchrist, P.A.; Lisa K. Jorgenson

(57) ABSTRACT

A circuit for generating a constant pulse signal from an enabling ATD input signal may include a latch structure connected between first and second circuit nodes, with each node being coupled to a corresponding charge and discharge capacitance and being also connected to respective inputs of a logic gate. The circuit may also include a memory element coupled to the circuit nodes for filtering the enabling ATD signal and avoiding a partial discharge of one of the capacitances. An output of the logic gate is provided for generating the pulse signal independent of voltage and/or temperature variations affecting the enabling ATD signal.

29 Claims, 5 Drawing Sheets

CIRCUIT FOR GENERATING AN ATD PULSE SIGNAL INDEPENDENT OF VOLTAGE AND TEMPERATURE VARIATIONS

FIELD OF THE INVENTION

The present invention relates to electronic circuits, and, more particularly, to a circuit for generating a pulse signal substantially independent of voltage and/or temperature variations.

BACKGROUND OF THE INVENTION

As is well known, reading of the cell contents of a semiconductor integrated electronic memory circuit is allowed by a predetermined operation sequence known as reading cycle. A reading cycle starts when the memory address of a cell to be read is presented to the input terminals of the memory circuit. An input stage detects the switching of an address located on such terminals, thus starting a reading operation. Row and column decoding circuits select the addressed memory word.

The circuit portion which is adapted to read the memory cell contents and convert the read analog data into digital data is referred to as sense amplifier or reading amplifier. The data detected by the sense amplifier is presented as an output by an output buffer stage.

Each of the above phases of the reading cycle should have a predetermined duration compatible with the memory access times provided by the memory circuit specifications. All the various phases of the reading cycle are clocked by synchronization pulses derived from a single main pulse called an Address Transition Detection (ATD) pulse. The ATD pulse is generated inside the memory circuit each time an address switching is detected on the input terminals.

The prior art provides for different examples of constant pulse generators using the principle of discharging a constant current capacity. One of the most considerable shortcomings of these circuits is due to the fact that the initial capacitance discharge takes place during the input pulse duration. If such a pulse is of short duration, the discharge is not complete and the circuit thus generates shorter pulses. Furthermore, such pulse generating circuits often need to be initialized during the power-on step of the system, thus often causing malfunctions.

The traditional ATD circuits are based on switching of a latch forced through two pull-down transistors which act on both sides of the latch. This approach is widely used both for its simplicity, as well as for its robustness.

In FIG. 1 a schematic example of the well-known ATD circuit is illustrated. These ATD circuits nevertheless introduce a problem of generating impulses having a duration dependent on the supply voltage or temperature. The latch inverters are made using certain transistors of the PMOS type with kp<<kn. At the moment of switching of the input terminal IN, one of the two capacities charges itself approximately in a linear way and, upon reaching the inverter threshold to which it is connected, the latch switches. The other capacitance is instead discharged immediately due to NMOS pull-down transistors, which are structured in such a way as to behave like switches.

The main drawback of a circuit like the one previously illustrated is due to the fact that the charge of the capacitance on which the circuit operation is based, is strongly influenced by the supply voltage and by the temperature, which affects the threshold of the PMOS transistors.

SUMMARY OF THE INVENTION

An object of the present invention is to provide a pulse generator circuit, such as, for example, an ATD type pulse generator, whose circuit has both functional and structural characteristics able to overcome the drawbacks which still affect the approaches of the prior art.

One embodiment of the invention provides the use of a memory element, for example a flip-flop, to filter the enabling ATD signal and avoid the problem of the partial discharge of one of the capacitances associated with the latch structure. According to this embodiment, the invention relates to a circuit for generating a constant pulse signal from an enabling ATD input signal and which may comprise a latch structure connected between first and second circuit nodes, each node being coupled to a corresponding charge and discharge capacitance and being also connected to respective inputs of a logic gate. The circuit may also include a memory element coupled to the circuit nodes for filtering the enabling ATD signal and avoiding a partial discharge of one of the capacitances. The circuit may also use an output of the logic gate for generating the constant pulse signal independent of voltage and/or temperature variations affecting the enabling ATD signal.

The filtering action of the memory element forces its output to switch after receipt of an input ATD pulse. Such an output does not switch if the input pulse is too narrow. The inventive circuit is thus transparent to the amplitude of the input pulses. Since the memory element is a bistable, there is no need to initialize it at the power-on phase.

BRIEF DESCRIPTION OF THE DRAWINGS

The features and advantages of the circuit pulse generator according to the invention will be apparent from the following detailed description of embodiments thereof, given as non-limiting examples with reference to the accompanying drawings, in which.

DETAILED DESCRIPTION OF THE PREFERRED EMBODIMENT

Figure 2:
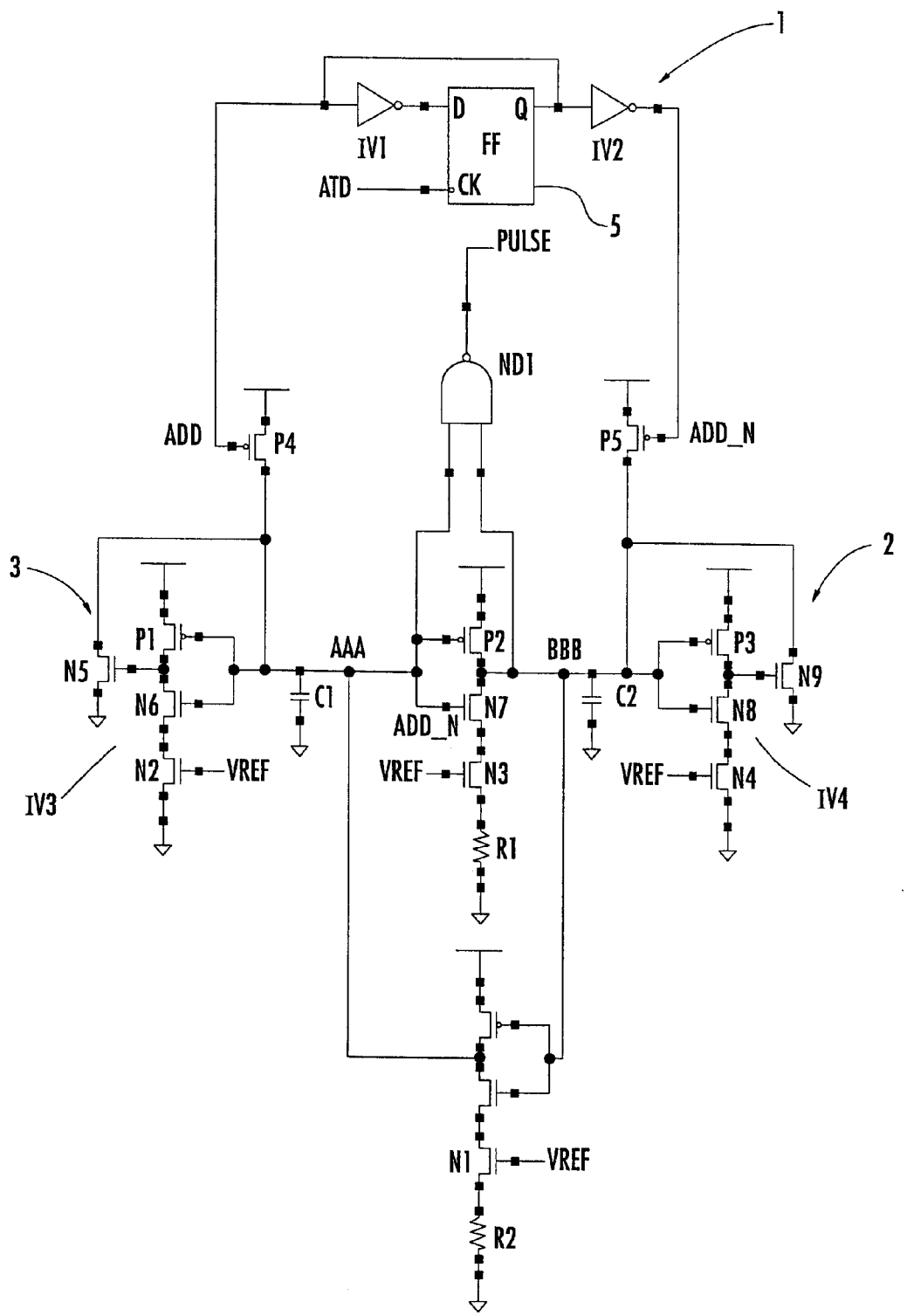
FIG. 2 is a schematic diagram of circuit for generating a pulse signal according to the present invention.

With reference to such figures, and specifically to the example of FIG. 2, with reference numeral 1 globally and schematically denoting a circuit realized according to the invention to generate pulses in a manner independent of voltage and/or temperature variations. More specifically, but not exclusively, the circuit 1 allows generating impulse signals for Address Transition Detection during a reading cycle of memory cells. The description which follows is made with reference to such a specific application field for clarity of explanation. Furthermore, by memory cells, we intend a plurality of memory elements incorporated in a conventional semiconductor integrated electronic device and structured with a matrix of cells organized in rows and columns. Corresponding circuit sections of rows and columns decoders are associated with the matrix, as well as reading amplifiers. The memory cells can be of whichever type, and specifically the non-volatile type may be preferred.

Figure 1:
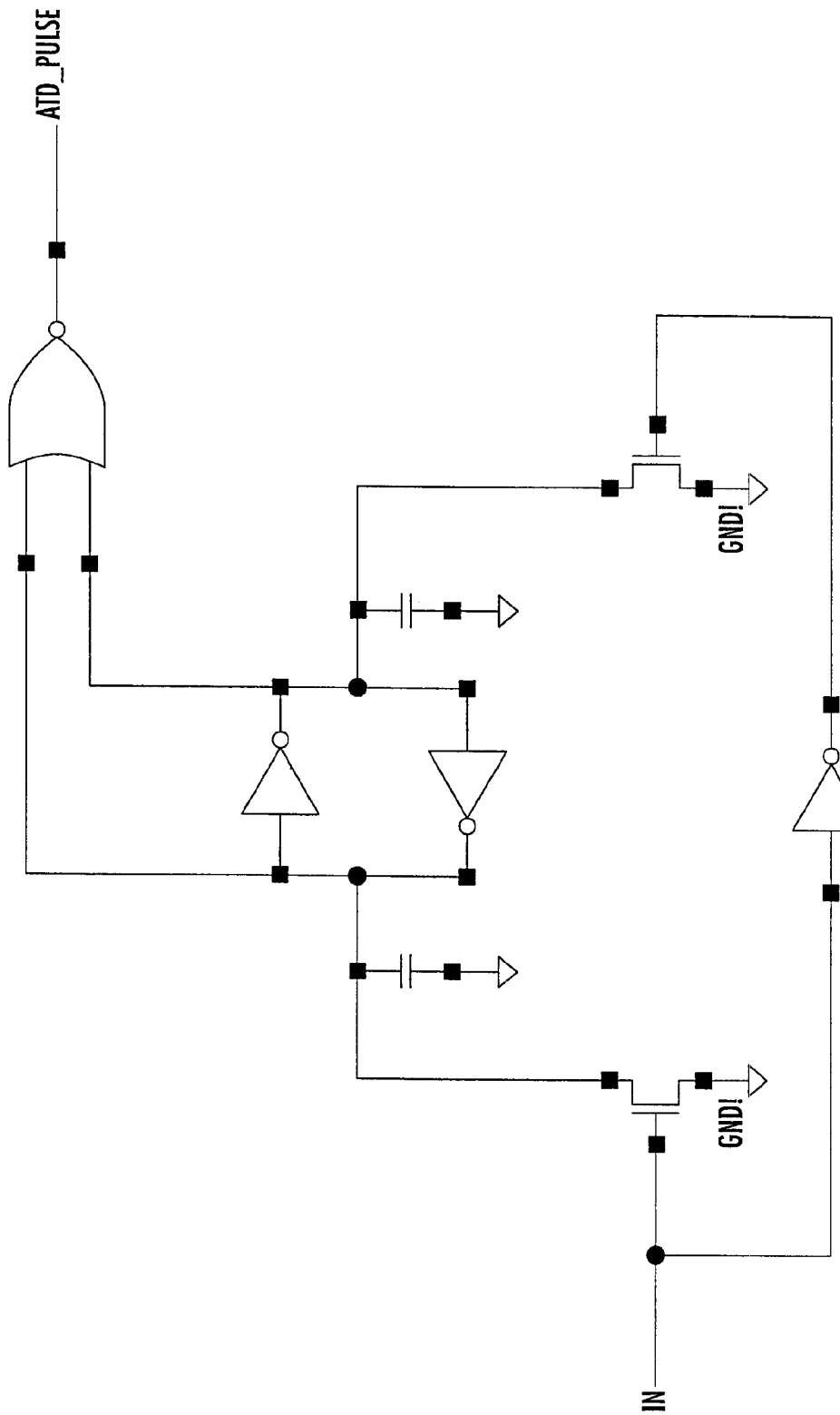
FIG. 1 is a schematic diagram of prior art circuit for generating an ATD pulse signal.

The circuit 1 according to the invention has been derived from the ATD (Address Transition Detection) circuit of FIG. 1, but it has been improved to obtain a constant current capacitance discharge. Moreover, an inventive approach has been used to render the latch switching independent of the threshold variations of the inverters incorporated into the latch itself.

A particular choice of the inverter which reveals the discharge level of the desired capacitance allows compensation of small variations of the discharge current with the temperature. Such variations are due to the thermal drift of the resistance incorporated into the current generator.

As shown in FIG. 2, the circuit 1 according to the invention comprises a first circuit portion 2 and a second circuit portion 3 which are symmetric with respect to one other. A logic gate ND1, for instance a logic NAND gate, produces on its output a pulse signal PULSE, and which receives as inputs signals from a corresponding circuit node AAA and BBB.

Between the nodes AAA and BBB there is a latch structure including a first inverter and a second inverter which are feedback connected to one another. The first inverter comprises two NMOS transistors N3, N7 and a PMOS transistor P2. A voltage reference signal Vref is applied to the transistor N3. A current generator is inserted between this first inverter and ground GND including the transistor N3 and a resistance R1.

The second inverter, in turn, is inserted between the circuit nodes AAA.and BBB in a counter-flow fashion as compared to the first inverter. This second inverter comprises two NMOS transistors and a PMOS transistor.

A voltage reference Vref is applied to the transistor N1. A current generator is inserted between this second inverter and ground GND and comprises transistor N1 and a serially connected resistance R2. The circuit nodes AAA and BBB are each coupled to ground GND through a charge and discharge capacitance C1, C2.

Advantageously, if compared to the traditional ATD circuit, such as the one shown in FIG. 1, the circuit 1 according to the invention comprises further circuit elements. More specifically, both circuit portions 2 and 3 comprise a related inverter IV3, IV4 having an input connected to one corresponding circuit node AAA, BBB and an output connected to the control terminal of a transistor.

In greater detail, the circuit portion 2 includes the inverter IV4 connected to the node BBB and comprising the PMOS transistor P3 and the pair of NMOS transistors N4, N8. A voltage reference signal Vref is applied on the transistor N4. The output of the inverter IV4 is connected to the control terminal of the transistor N9, of the NMOS type, having a first conduction terminal connected to the node BBB and the other conduction terminal connected to ground GND.

The circuit portion 3 comprises the inverter IV3 connected to the node AAA and comprising the PMOS transistor P1 and a pair of NMOS transistors N2, N6. A voltage reference signal Vref is applied to the transistor N2. The output of the inverter IV3 is connected to the control terminal of the transistor N5, of the NMOS type, having a first conduction terminal connected to the node AAA and the other conduction terminal connected to ground GND.

The structure of the circuit 1 is completed by respective transistor switches, one for each circuit portion 2, 3 and receiving on their control terminals a respective enabling signal ADD or ADD_N. The circuit portion 2 comprises a transistor P5, for instance a PMOS transistor, receiving on its control terminal an enabling signal ADD_N and being inserted with its conduction terminals between a supply reference Vdd and the circuit node BBB.

The circuit portion 3 comprises a transistor P4, for instance a PMOS transistor, receiving on its control terminal an enabling signal ADD and being inserted with its conduction terminals between a supply reference Vdd and the circuit node AAA.

The control terminals of the transistors P4 and P5 are interconnected by a feedback path comprising the series connection of a first inverter IV1, a memory element 5 and a second inverter IV2. The memory element 5 may be a flip-flop of the D-type having an input D connected to the output of the first inverter IV1 and an output Q connected to the input of the second inverter IV2. The clock terminal CK of the flip-flop 5 receives the ATD signal. A by-pass connection is also provided between the input of the first inverter IV1 and the output Q of the flip-flop 5.

The circuit 1 is perfectly symmetric and, for simplicity of disclosure, we will evaluate hereinafter just one of the two possible operation cases. First, suppose that the latch including the inverters coupled between the circuit nodes AAA and BBB will start from an initial condition with AAA=0 and BBB=Vdd. This initial condition corresponds to the signals ADD=1 and ADD_N=0 as well as the output PULSE=1.

An ATD pulse always produces a switching on the flip-flop output. Thus, we will have ADD=0 and ADD_N=1. AAA is charged quickly to the Vdd value, since the transistors P4 and P5 are sized as switches, so the transistor of the inverter IV4 is turned on.

In this case PULSE=0, that is the starting phase of the pulse. The node BBB is charged with a constant current supplied by the transistor N3. The current fed by this transistor N3 does not depend on the supply voltage, since the voltage reference Vref is constant. It also does not depend on temperature since the resistance R1 compensates possible current variations due to the threshold variations, for instance for a temperature effect. If the discharge current is reduced by the effect of the threshold variation, then the voltage drop on the resistance R1 is reduced too. Accordingly, the voltage drop Vgs on the transistor N3 is raised thus compensating the current reduction.

So the capacitance discharge is performed in a linear manner always with the same slope starting from the Vdd value. Upon having reached the threshold value of the inverter IV2, that is sized in such a manner to have a relatively high threshold if compared to the other inverter IV1, the feedback path including the transistor N9 fast discharges node BBB to 0.

At this point PULSE=1 since it is the pulse end. If we evaluate the circuit operation through mathematic formulas we obtain:

$$I = C \cdot \frac{\Delta V}{\Delta T}$$

that is:

$$\Delta T = C \cdot \frac{\Delta V}{I}$$

with $$V_t = \frac{V_{dd} + \sqrt{\frac{\mu_n(W/L)_n}{\mu_p(W/L)_p}} \cdot V_{tn} - |V_{tp}|}{1 + \sqrt{\frac{\mu_n(W/L)_n}{\mu_p(W/L)_p}}}$$

and $$\Delta V = V_{dd} - V_t$$

where $V_t$ represents the threshold voltage of the second inverter IV2, I the current produced by the current generator including the resistance R1 and the transistor N3. It must be noted that the inverter threshold is independent of the voltage. If the threshold is very high, that is when: Wp/Lp>>Wn/Ln we obtain:

$$V_t = V_{dd} + \sqrt{\frac{k_n}{k_p}} \cdot V_{tn} - |V_{tp}|$$

and $$\Delta V = V_{dd} - V_{dd} + \sqrt{\frac{k_n}{k_p}} \cdot V_{tn} - |V_{tp}| \cong -|V_{tp}|$$

with $$\Delta T \cong C \cdot \frac{|V_{tp}|}{I}$$

So, as provided by the inventive circuit 1 the pulse duration does not depend on Vdd.

Now we consider the manner in which the temperature variation has been compensated. The current I depends on temperature because of the temperature variation of the resistance R. Its temperature dependence is inversely proportional to the temperature according to the following relationship:

$$I = \frac{I_0}{(1 + \alpha(T - T_0))}$$

The threshold voltage of the inverter IV2 has the same temperature dependence.

$$V_{tp} = \frac{V_{t0}}{(1 + \beta(T - T_0))}$$

As a whole we obtain:

$$\Delta T = C \cdot \left(\frac{V_{t0}}{I_0}\right) \cdot \frac{(1 + \beta(T - T_0))}{(1 + \alpha(T - T_0))}$$

and forcing $\alpha = \beta$ we have:

$$\Delta T = C \cdot \left(\frac{V_{t0}}{I_0}\right)$$

Figure 3:
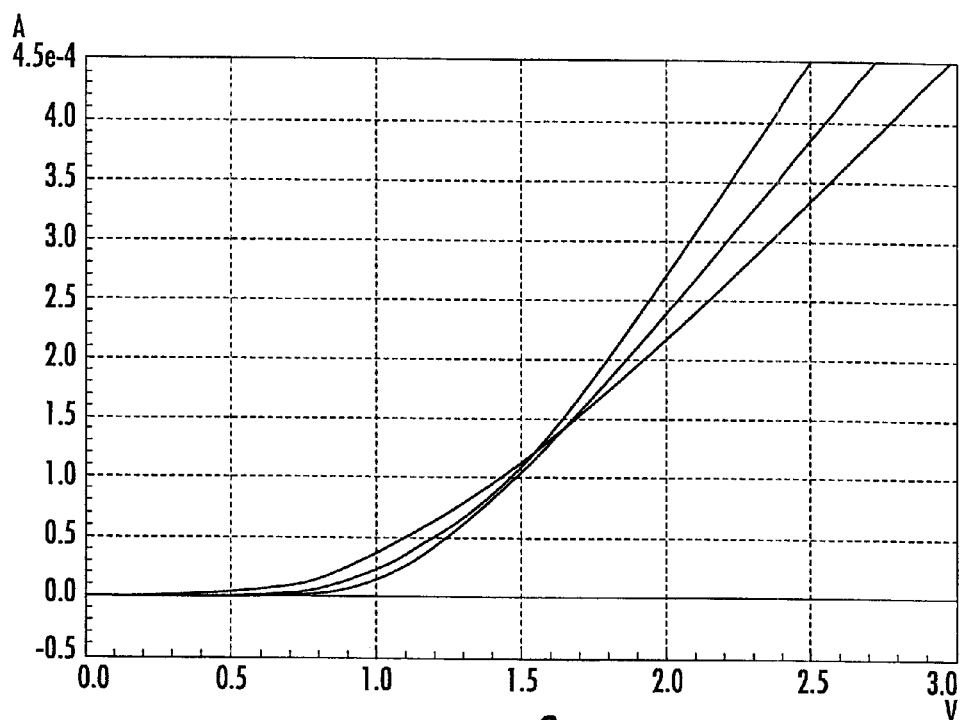
FIG. 3 are plots of current vs. voltage for a set of characteristic curves illustrating the temperature dependence of an NMOS transistor.
Figure 4:
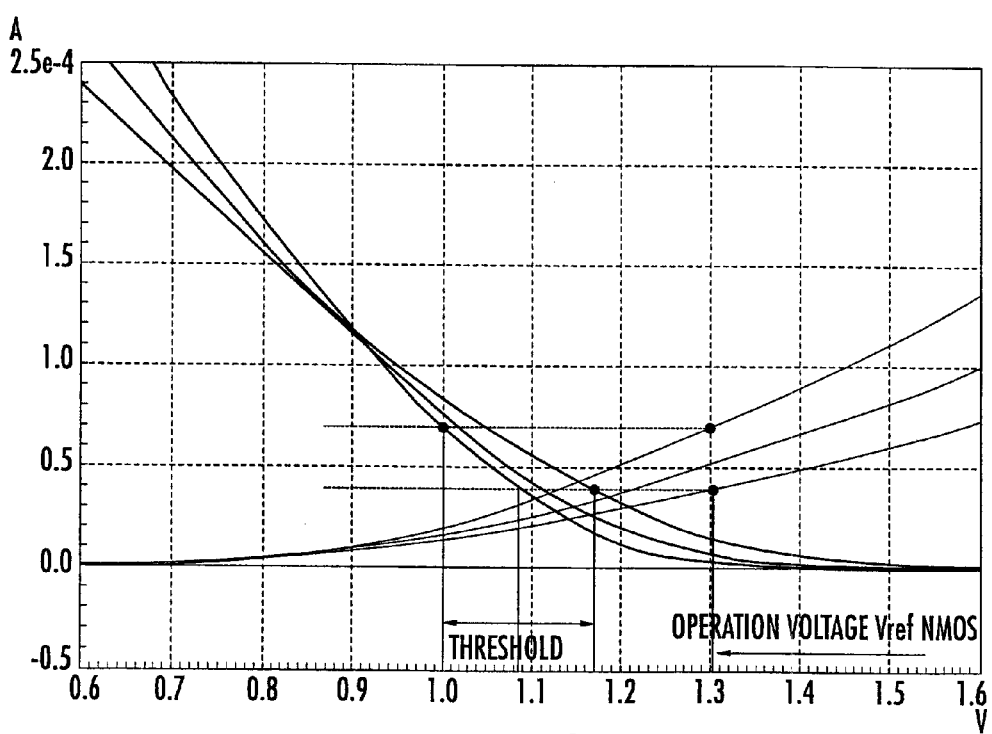
FIG. 4 are plots of current vs. voltage for a set of characteristic curves illustrating the temperature dependence of an inverter threshold.

It is possible to act on the β parameter by using a constant current inverter, for instance by forcing the operation of the current generator N3, R1 after the intersection zone of the characteristic curves shown in FIG. 3. In other words, the current generator is forced to work in a zone wherein the current depends inversely on temperature and the PMOS transistor is in the zone before the intersection wherein the current depends directly on temperature.

Figure 5:
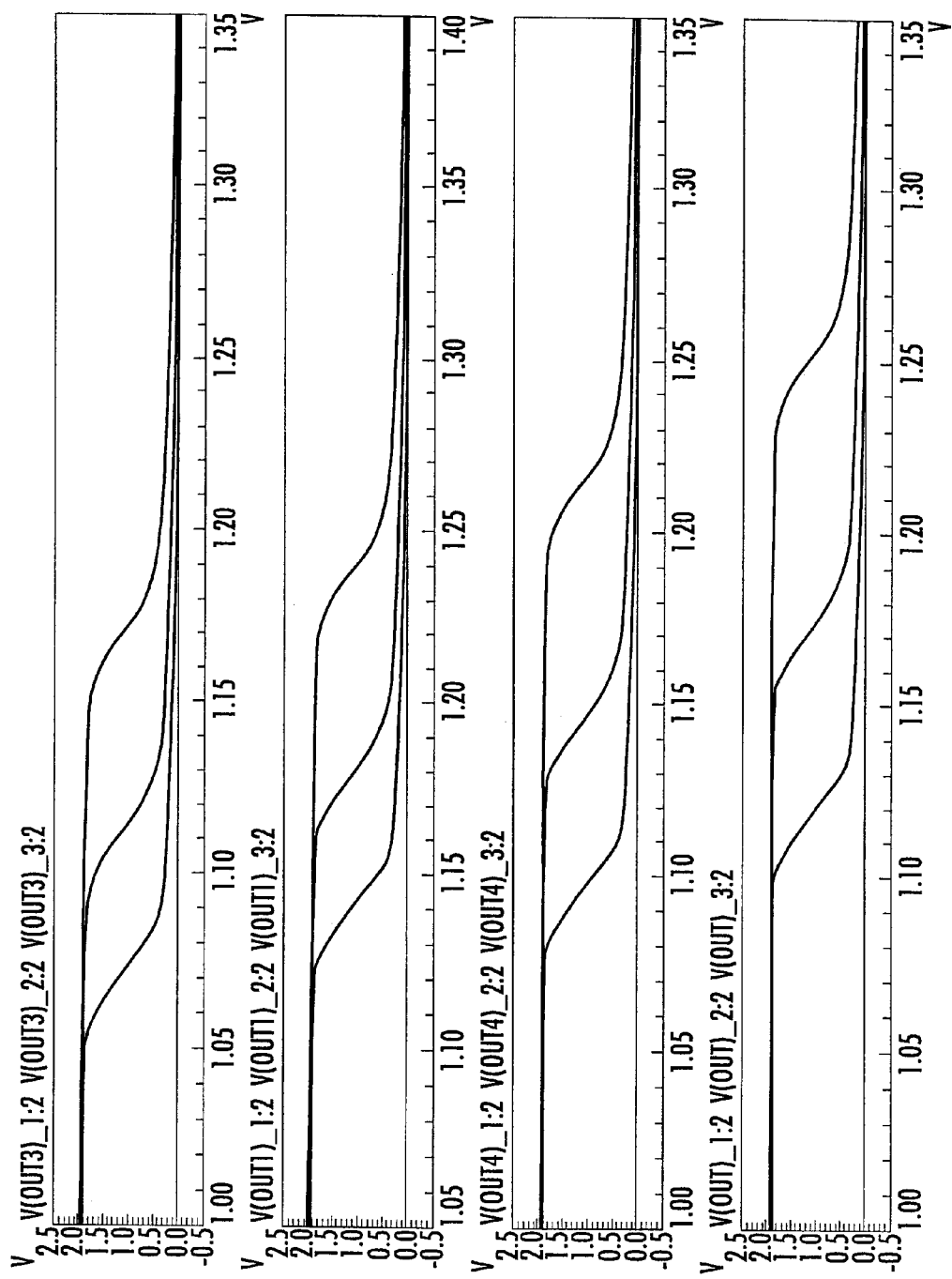
FIG. 5 are plots of current vs. voltage, having the same time base, for a set of characteristic curves illustrating the threshold temperature dependence of different inverters.

In this manner it is possible to obtain an inverter that works in a direct dependence on temperature and in an improved dependence if compared to known CMOS inverters. Reference is made to the curves shown in FIG. 5 that illustrate the threshold variations of different inverters according to the temperature variations.

Therefore it's possible to act on the β parameter to precisely match the a parameter. In other words, the threshold stability is obtained by using an asymmetric inverter. While the temperature stability has been obtained by compensating the small discharge current variation of the capacitance with an opposite variation of the inverter threshold.

Figure 6:
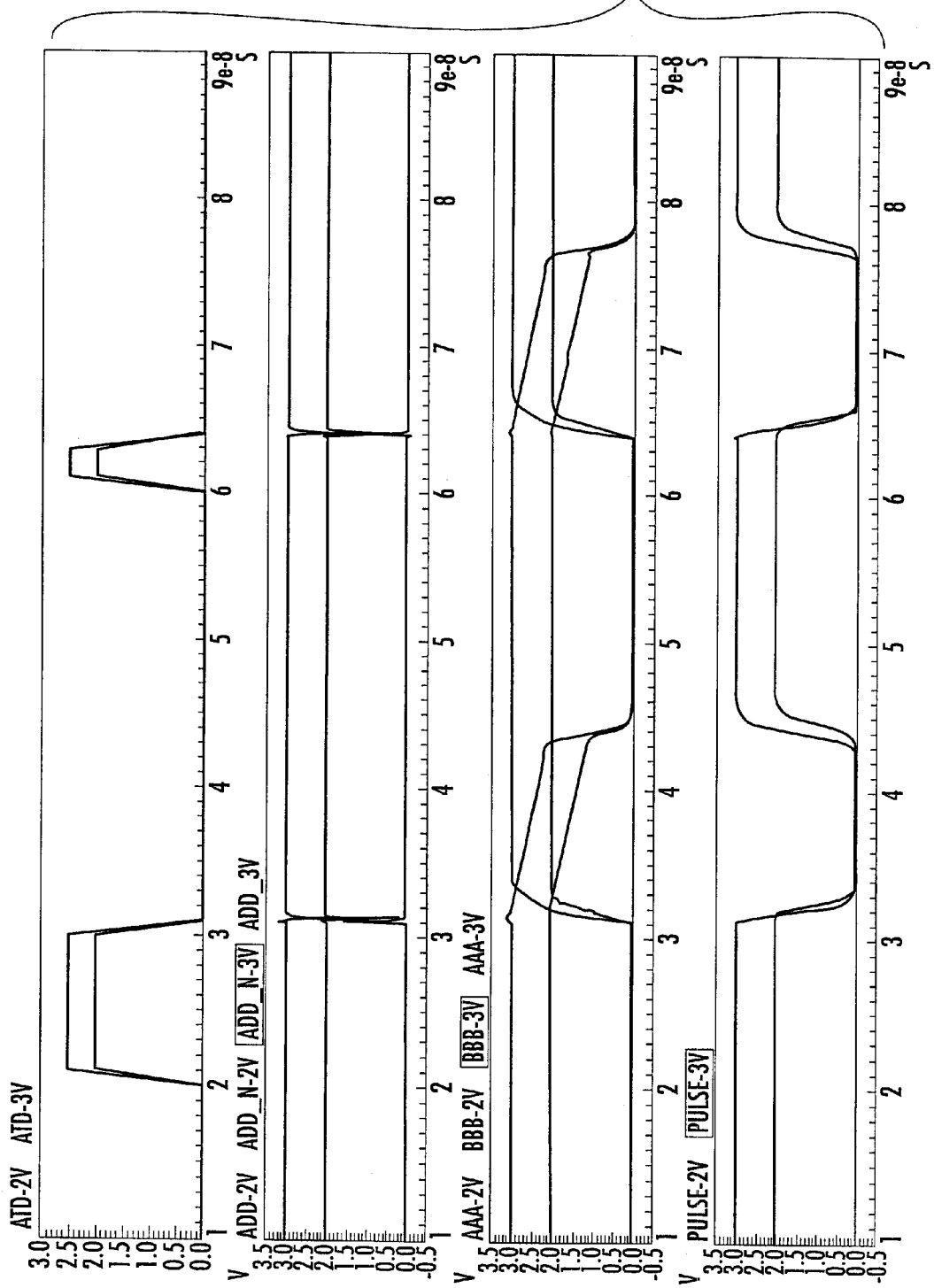
FIG. 6 are plots of voltage vs. time illustrating the pattern of various signals of the circuit according to the invention.

The results of a simulation are reported in the diagrams shown in FIG. 6. The more important signals of the inventive circuit are illustrated in these diagrams. The circuit according to the invention achieves many advantages the most important of which is given by the total independence from voltage and temperature variations of the output pulse signal.

Moreover, the circuit allows generation of a pulse having a constant duration starting from an ATD pulse having a duration variable based upon voltage and temperature. So, by applying to the inventive circuit a variable ATD pulse, a constant output pulse is obtained having a duration that is independent of the input pulse duration. The input ATD pulse is used just as a trigger pulse. According to the memory element incorporated into the inventive circuit, the raising or falling edge of the ATD pulse signal may be used for the triggering function.

From the foregoing it will be appreciated that, although specific embodiments of the invention have been described herein for purposes of illustration, various modifications may be made without deviating from the spirit and scope of the invention. Accordingly, the invention is not limited except as by the appended claims.

That which is claimed is:

1. A circuit for generating a pulse signal independent of at least one of voltage and temperature variations and comprising:
    a pair of symmetric circuit portions including first and second nodes;
    a latch connected between the first and second nodes;
    a corresponding charge and discharge capacitance connected to each of the first and second nodes;
    at least one logic gate having inputs connected to the first and second nodes and having an output generating the pulse signal based upon receipt of an enabling ATD signal; and
    a memory element connected to the first and second nodes for filtering the enabling ATD signal thus avoiding a partial discharge of at least one of the capacitances.

2. A circuit according to claim 1, wherein said at least one logic gate generates the pulse signal having a constant duration.

3. A circuit according to claim 1, wherein the capacitance discharge is obtained using a constant current.

4. A circuit according to claim 1, wherein said memory element comprises a flip-flop.

5. A circuit according to claim 4, further comprising:
   a first transistor and a first inverter connected in series between the first node and an input of said flip-flop; and
   a second inverter and a second transistor connected in series between an output of said flip-flop and the second node.

6. A circuit according to claim 5, wherein the first transistor has a control terminal receiving the enabling ATD signal; and wherein the second transistor has a control terminal receiving an inverted enabling ATD signal.

7. A circuit according to claim 1, wherein said latch comprises first and second inverters feedback connected to one another; and wherein each inverter comprises a resistance and a series of transistors connected thereto between first and second voltage references.

8. A circuit according to claim 7, wherein the series of transistors comprises a third transistor connected to said resistance and which forms therewith a current generator; and wherein the third transistor has a control terminal connected to a third voltage reference having a constant value.

9. A circuit according to claim 7, wherein the first and second inverters detect a charge level of a corresponding capacitance.

10. A circuit according to claim 1, further comprising a respective transistor and inverter series connected to each of the first and second nodes.

11. A circuit for generating a pulse signal independent of at least one of voltage and temperature variations and comprising:
    first and second nodes and a latch connected therebetween;
    a respective capacitance connected to each of the first and second nodes;
    at least one logic gate having respective inputs connected to the first and second nodes and having an input receiving an enabling ATD signal, said at least one logic gate having an output generating the pulse signal based upon receipt of the enabling ATD signal; and
    a memory element coupled to the first and second nodes for filtering the enabling ATD signal.

12. A circuit according to claim 11, wherein said at least one logic gate generates the pulse signal having a constant duration.

13. A circuit according to claim 11, wherein the capacitance discharge is obtained using a constant current.

14. A circuit according to claim 11, wherein said memory element comprises a flip-flop.

15. A circuit according to claim 14, further comprising:
    a first transistor and a first inverter connected in series between the first node and an input of said flip-flop; and
    a second inverter and a second transistor connected in series between an output of said flip-flop and the second node.

16. A circuit according to claim 15, wherein the first transistor has a control terminal receiving the enabling ATD signal; and wherein the second transistor has a control terminal receiving an inverted enabling ATD signal.

17. A circuit according to claim 11, wherein said latch comprises first and second inverters feedback connected to one another; and wherein each inverter comprises a resistance and a series of transistors connected thereto between first and second voltage references.

18. A circuit according to claim 17, wherein the series of transistors comprises a third transistor connected to said resistance and which forms therewith a current generator; and wherein the third transistor has a control terminal connected to a third voltage reference having a constant value.

19. A circuit according to claim 17, wherein the first and second inverters detect a charge level of a corresponding capacitance.

20. A circuit according to claim 11, further comprising a respective transistor and inverter series connected to each of the first and second nodes.

21. A memory device comprising:
    first and second nodes and a latch connected therebetween;
    a respective capacitance connected to each of the first and second nodes;
    at least one logic gate having respective inputs connected to the first and second nodes and having an input receiving an enabling ATD signal, said at least one logic gate having an output generating the pulse signal based upon receipt of the enabling ATD signal; and
    a memory element coupled to the first and second nodes for filtering the enabling ATD signal.

22. A memory device according to claim 21, wherein said at least one logic gate generates the pulse signal having a constant duration.

23. A memory device according to claim 21, wherein the capacitance discharge is obtained using a constant current.

24. A memory device according to claim 21, wherein said memory element comprises a flip-flop.

25. A method for generating a pulse signal independent of at least one of voltage and temperature variations and comprising:
    connecting a latch between first and second circuit nodes, with each node being coupled to a corresponding charge and discharge capacitance and being also connected to respective inputs of at least one logic gate; and
    filtering the enabling ATD signal and avoiding a partial capacitance discharge so that an output of the logic gate provides the pulse signal independent of at least one of voltage and temperature variations affecting the enabling ATD signal.

26. A method according to claim 25, wherein filtering comprises using a memory element connected to the first and second nodes.

27. A method according to claim 25, wherein said at least one logic gate generates the pulse signal having a constant duration.

28. A method according to claim 25, wherein the capacitance discharge is obtained using a constant current.

29. A method according to claim 26, wherein the memory element comprises a flip-flop.

* * * * *